United States Patent
Tuayev-Deane et al.

(10) Patent No.: US 12,183,898 B2
(45) Date of Patent: Dec. 31, 2024

(54) CURRENT SENSOR FAULT DIAGNOSTICS

(71) Applicant: GM GLOBAL TECHNOLOGY OPERATIONS LLC, Detroit, MI (US)

(72) Inventors: Gregory G. Tuayev-Deane, Utica, MI (US); Xinyu Du, Oakland Township, MI (US); Chaitanya Sankavaram, Rochester Hills, MI (US)

(73) Assignee: GM Global Technology Operations LLC, Detroit, MI (US)

(*) Notice: Subject to any disclaimer, the term of this patent is extended or adjusted under 35 U.S.C. 154(b) by 629 days.

(21) Appl. No.: 17/555,776

(22) Filed: Dec. 20, 2021

(65) Prior Publication Data

US 2023/0198037 A1    Jun. 22, 2023

(51) Int. Cl.
  *H01M 10/48*     (2006.01)
  *B60K 1/04*      (2019.01)
  *B60L 58/12*     (2019.01)

(52) U.S. Cl.
  CPC ............ *H01M 10/486* (2013.01); *B60K 1/04* (2013.01); *B60L 58/12* (2019.02); *H01M 2220/20* (2013.01)

(58) Field of Classification Search
  USPC .................................. 324/426–427, 430–435
  See application file for complete search history.

(56) References Cited

U.S. PATENT DOCUMENTS 5,321,627 A * 6/1994 Reher ................ G01R 31/3648
                                               340/636.15
2021/0302502 A1* 9/2021 Bamberger .......... G01R 31/367

\* cited by examiner

*Primary Examiner* — Vincent Q Nguyen
(74) *Attorney, Agent, or Firm* — Quinn IP Law

(57) ABSTRACT

A battery electric system includes a battery, sensor suite, and controller. The sensor suite includes a current sensor, voltage sensor, and temperature sensor. The controller is operable for determining an estimated open circuit voltage of the battery at different time points using a current signal and a voltage signal from the current and voltage sensors, and an equivalent circuit model (ECM). The controller determines an ECM-based state of charge (SOC) of the battery at the different time points, via a calibrated SOC map, using the open circuit voltage and temperature, and calculates a sensor gain value using the ECM-based SOC and a coulomb counting-based SOC, both at the different time points. A control action is executed with respect to the battery when the sensor gain value exceeds a predetermined gain fault threshold, including generating a fault notification signal indicative of a fault of the current sensor.

20 Claims, 3 Drawing Sheets

CURRENT SENSOR FAULT DIAGNOSTICS

INTRODUCTION

The present disclosure relates to alternative methodologies for faults in a current sensor, e.g., of a battery electric system. Mobile and stationary systems may include one or more electric traction motors, the phase windings of which are energized by controlled discharge of a propulsion battery pack. Output torque generated by the energized traction motor(s) may be directed to a driven load, for instance the driven road wheels of a motor vehicle, via gear sets or other intervening power transfer mechanisms.

A propulsion battery pack includes an application-specific number and arrangement of electrochemical battery cells. Electronic cell sense boards (CSBs) are typically connected to electrodes of the cells or cell groups, with the CSBs collectively measuring cell and/or pack-level temperatures, voltages, and currents. The CSBs then report the measured battery parameters to a resident battery controller, either over physical transfer conductors or using wireless communication. The battery controller in turn regulates the ongoing operation and thermal management efforts of the battery pack and associated power electronics.

Certain measured or derived battery parameters rely on accurate pack current measurements, with such parameters including state of charge (SOC), state of health (SOH), and internal resistance. In a representative propulsion battery pack, the pack current provided to a connected load is measured by a corresponding current sensor circuit in which the battery current is often determined based on a voltage drop across a fixed shunt resistor. When the shunt resistor degrades due to corrosion, age, or damage, the measured current values tend to have artificially high magnitudes. The same inaccuracies may result from degradation or damage to other types of current sensors. Battery packs with higher or lower magnitude current readings in turn appear to charge or discharge at a particular rate, with the actual rate being a higher or lower value. At the same time, battery resistance estimates would appear to be larger or smaller than they actually are, which in turn causes a resident battery controller to register false negative results when running certain cell fault diagnostic algorithms.

SUMMARY

The hardware and software solutions described herein enable detection of current sensor faults in a current sensor. As a result of the present inability to accurately detect such faults in an assembled and operational battery pack, the present state of the art lacks a reliable way to mitigate current sensor faults. In contrast, the methodologies detailed below may, when appropriate, prolong the use of a faulty current sensor via logical adjustments. This enables an onboard controller to compensate for measurement errors without triggering intervening maintenance actions, or by alerting an operator to the need for such maintenance actions whenever the sensor errors exceed a threshold.

An aspect of the present disclosure includes a battery electric system having a battery, a sensor suite, and an electronic controller. The sensor suite contemplated herein includes a current sensor, voltage sensor, and temperature sensor, which are respectively operable for outputting a current signal indicative of a measured pack current of the battery, a voltage signal indicative of a measured voltage of the battery, and a temperature signal indicative of a measured temperature of the battery. In some embodiments, the current sensor may include a fixed shunt resistor of the type noted generally above, with the present teachings also benefitting diagnosis of other types of current sensors.

The controller in this exemplary embodiment is in communication with the sensor suite, and is configured to determine an estimated open circuit voltage of the battery at different time points. This occurs using the current signal, the voltage signal, and an equivalent circuit model (ECM). The controller is configured to determine a state of charge ($SOC_{ECM}$) of the battery at the different time points, via a calibrated SOC map, using the estimated OCV and the measured temperature signal. The controller is also configured to calculate a sensor gain value using the ECM-based SOC ($SOC_{ECM}$) of the battery at the different time points. The controller ultimately executes a control action when the sensor gain value exceeds a predetermined fault threshold, with the control action possibly including generating a fault notification code indicative of a fault of the current sensor.

The state of charge ($SOC_{ECM}$) of the battery may be determined via the controller as a function ($f$) of the estimated OCV and the measured battery temperature, such that:

$$SOC_{ECM} = f(OCV, T)$$

with OCV being the estimated OCV and T representing the measured battery temperature.

The control action in some implementations includes selectively adjusting the measured battery current based on the sensor gain value. For example, the controller may be configured to selectively adjust the measured battery current based on the sensor gain value, e.g., when the sensor gain value is less than or greater than a service threshold, to generate a corrected current value (Icon) using an equation:

$$I_{COR} = \frac{I_M}{G}$$

with $I_M$ being the measured pack current and G being the sensor gain value. For simplicity, the different time points may include at least first and second time points, with the controller configured to calculate the sensor gain value as:

$$\frac{\Delta SOC_{CC}}{\Delta SOC_{ECM}}$$

where $\Delta SOC_{CC}$ is a difference between respective coulomb counting-based SOC values at the first and second time points, and $\Delta SOC_{ECM}$ is a difference between respective ECM-based SOCs ($SOC_{ECM}$) of the battery at the first and second time points.

In some embodiments, the controller may request a maintenance action based on the sensor gain value. The controller may also be configured to calculate the sensor gain value using the ECM-based state of charge ($SOC_{ECM}$) of the battery and a coulomb counting-based SOC value ($SOC_{CC}$).

A method for diagnosing a current sensor fault in the battery electric system is also disclosed herein. An exemplary embodiment of the method includes communicating, via the current sensor, voltage sensor, and temperature sensor, respectively, a current signal indicative of a measured current of the battery, a voltage signal indicative of a measured voltage of the battery, and a temperature signal indicative of a measured temperature of the battery. As noted above, the current sensor may optionally include a shunt resistor. The method includes determining an estimated open circuit voltage of the battery at different time points using the current signal, the voltage signal, and an ECM, and determining an ECM-based state of charge of the battery at the different time points, via a calibrated SOC map, using the estimated open circuit voltage and the measured temperature.

Additionally, the method in this embodiment includes calculating a sensor gain value using the ECM-based SOC and coulomb counting-based SOC ($SOC_{CC}$) of the battery at the different time points. A processor of the battery electric system also executes a control action with respect to the battery based on the sensor gain value, with the control action including generating a fault notification signal indicative of a fault of the current sensor.

Also disclosed herein is a motor vehicle having road wheels and an electrified powertrain system operable for outputting a drive torque thereto, i.e., to propel the motor vehicle. The electrified powertrain system includes a propulsion battery pack, an electric traction motor connected to the propulsion battery pack, a sensor suite, and a controller. The electrified powertrain system is operable for generating the drive torque when energized by a discharge of the propulsion battery pack, e.g., via a power inverter module when the motor is a polyphase device. The sensor suite includes the above-noted current, voltage, and temperature sensors. The vehicle controller is in communication with the sensor suite, and is configured to diagnose the current sensor's performance using the method of the present disclosure.

BRIEF DESCRIPTION OF THE DRAWINGS

FIG. 3 is a flow chart describing an approach for constructing an open circuit voltage (OCV)-to-state of charge (SOC) map for use aboard the motor vehicle of FIG. 1.

DETAILED DESCRIPTION

Figure 1:
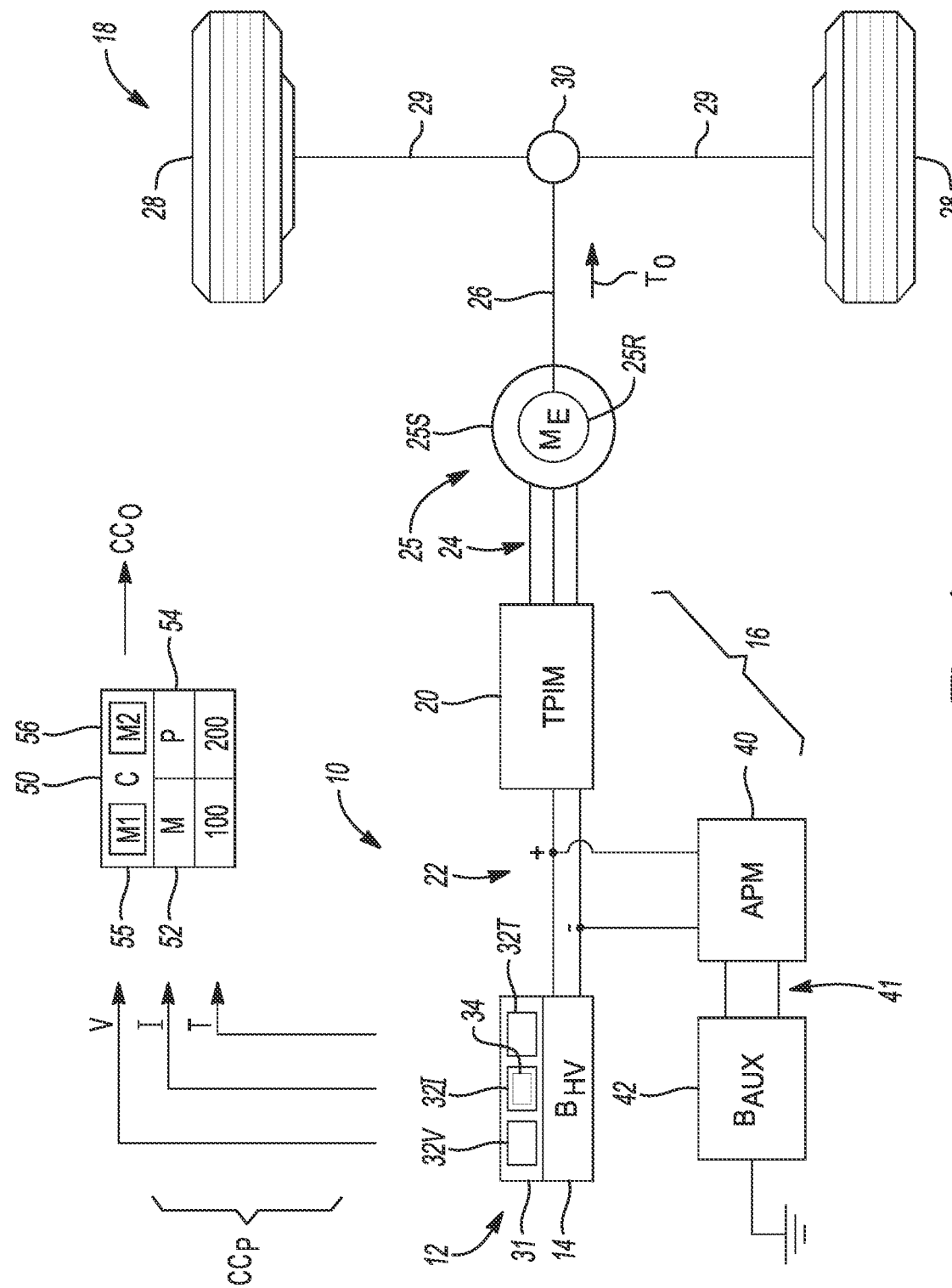
FIG. 1 is schematic illustration of a motor vehicle having a propulsion battery pack, with the battery pack including a current sensor that is diagnosed using the strategy detailed herein.

The present disclosure is susceptible of embodiment in many different forms. Representative examples of the disclosure are shown in the drawings and described herein in detail as non-limiting examples of the disclosed principles. To that end, elements and limitations described in the Abstract, Introduction, Summary, and Detailed Description sections, but not explicitly set forth in the claims, should not be incorporated into the claims, singly or collectively, by implication, inference, or otherwise.

For purposes of the present description, unless specifically disclaimed, use of the singular includes the plural and vice versa, the terms "and" and "or" shall be both conjunctive and disjunctive, "any" and "all" shall both mean "any and all", and the words "including", "containing", "comprising", "having", and the like shall mean "including without limitation". Moreover, words of approximation such as "about", "almost", "substantially", "generally", "approximately", etc., may be used herein in the sense of "at, near, or nearly at", or "within 0-5% of", or "within acceptable manufacturing tolerances", or logical combinations thereof.

Referring to the drawings, wherein like reference numbers refer to like features throughout the several views, and beginning with FIG. 1, a battery electric system 10 includes an energy storage system 12 having an electrochemical battery 14, e.g., a battery cell, module, or an application-suitable number of battery cells or modules assembled into a battery pack. As shown in FIG. 1, the energy storage system 12 is part of an electrified powertrain system 16 of a motor vehicle 18, for instance a full, hybrid, or extended-range electric vehicle (EV) in which the battery 14 functions as a high-voltage propulsion battery pack ($B_{HV}$). In such a configuration, the battery 14 may be connected to a traction power inverter module (TPIM) 20 via positive (+) and negative (−) rails of a direct current (DC) voltage bus 22. As appreciated in the art, ON/OFF state switching control of the TPIM 20 is used to convert a DC input voltage to the TPIM 20 to a polyphase/alternating current (AC) output voltage. The AC output voltage energizes an AC voltage bus 24, e.g., nominal a, b, and c phases of a representative three-phase configuration of the AC voltage bus 24.

In the representative configuration of the motor vehicle 18, the AC voltage bus 24 connects the TPIM 20 to an electric traction motor (ME) 25. In particular, the electric traction motor 25 may include a wound stator 25S surrounding a magnetic rotor 25R, with an output member 26 coupled to the rotor 25R ultimately connected to a set of road wheels 28 disposed on one or more drive axles 29. When the electric traction motor 25 is energized by the battery 14 via the TPIM 20 in such a configuration, or directly in a DC motor embodiment, the rotor 25R rotates within the stator 25S and thereby generates output torque (arrow $T_O$) as a drive torque. Embodiments of the electric powertrain system 16 may include an electronic or mechanical differential 30, with the differential 30 rotatably connecting the drive axles 29 as independently controllable elements, e.g., when distributing the output torque (arrow $T_O$) to the road wheels 28 to propel the motor vehicle 18.

Other power electronic components used as part of the exemplary electric powertrain system 16 shown in FIG. 1 may include an auxiliary power module (APM) 40 connected to the DC voltage bus 22, and an auxiliary battery ($B_{AUX}$) 42 connected to the APM 40 via an auxiliary voltage bus 41. As used herein, "auxiliary" refers to low voltage levels relative to the voltage level of the DC voltage bus 22, with typical auxiliary voltage levels for automotive applications being 12-15V. By comparison, the DC voltage bus 22 may have a corresponding voltage level of 60-400V or more depending on the application.

As part of the present diagnostic strategy, the battery 14 of FIG. 1 includes a sensor suite 31 configured to output a set of battery parameters ($CC_P$). The sensor suite 31 includes a current sensor 32I, e.g., a Hall-effect sensor. The sensor suite 31 also includes a voltage sensor 32V and a temperature sensor 32T, such as a thermocouple or a thermistor. Performance of the current sensor 32I in particular, which optionally includes a shunt resistor ($R_S$) 34, is diagnosed via a controller 50 as set forth in detail below with reference to FIGS. 2-4. The current sensor 32I is operable for outputting a current signal (arrow I) indicative of a measured battery current of the battery 14, with the current sensor 32I possibly doing so based on a voltage drop occurring across the optional shunt resistor 34, as appreciated in the art. As noted above, certain measured or derived battery parameters rely on accurate measurements of battery current, including calculations of the present state of charge (SOC), state of health (SOH), and internal resistance of the battery pack 14. The present strategy thus enables the controller 50 to diagnose faults of the current sensor 32I, and to respond to such faults in an appropriate manner depending on fault severity.

Further with respect to the sensor suite 31, the voltage sensor 32V is operable for outputting a voltage signal (arrow V) indicative of a measured cell, module, or pack-level voltage of the battery 14. In a similar vein, the temperature sensor 32T is operable for outputting a temperature signal (arrow T) indicative of a measured temperature of the battery 14. The sensor suite 31 may include additional sensors not mentioned here. Additionally, while described in singular terms for illustrative simplicity, multiple current sensors 32I, voltage sensors 32V, and temperature sensors 32T may be used in other embodiments, and therefore reference to a singular sensor type applies to embodiments inclusive of multiple sensors of the same type, unless otherwise specified.

The controller 50 is configured to execute the present strategy aboard the motor vehicle 18 in its capacity as a resident vehicle controller in some embodiments. Alternatively, it is possible for the controller 50 depicted in FIG. 1 to send raw current, voltage, and temperature data to an offboard server, computer, or processing unit, with the disclosed open circuit voltage estimation performed at such a processing node. Therefore, the controller 50 of FIG. 1 may be embodied as one or more processing nodes, some of which may be located aboard the motor vehicle 18, with others possibly being located offboard. For the purposes of executing the present diagnostic strategy, including the methods 100 and 200 of FIGS. 3 and 4, the controller 50 is equipped with application-specific amounts of the volatile and non-volatile memory (M) 52 and one or more of processor(s) (P) 54, e.g., microprocessors or central processing units, as well as other associated hardware and software, for instance a digital clock or timer, input/output circuitry, buffer circuitry, Application Specific Integrated Circuits (ASICs), systems-on-a-chip, electronic circuits, and other requisite hardware as needed to provide the programmed functionality.

Within the scope of the present disclosure, the controller 50 of FIG. 1, which is in communication with the sensor suite 31, ultimately responds to the battery parameters ($CC_P$) by generating output signals (arrow $CC_O$) as part of a control action. This action may occur when a sensor gain value calculated as set forth below with reference to FIGS. 2-4 exceeds a predetermined fault threshold, and may include generating a fault notification indicative of a fault of the current sensor 32I, e.g., of the shunt resistor 34, among other possible control actions. As part of this effort, the controller 50 is operable for determining an estimated open circuit voltage (OCV) of the battery 14 at different time points using the current signal (arrow I), the voltage signal (arrow V), and an equivalent circuit model (M1) 55. The controller 50 also determines an ECM-based state of charge ($SOC_{ECM}$) of the battery 14 at the different time points, via a calibrated SOC map (M2) 56, with the abbreviation "ECM" representing the equivalent circuit model 55. The controller 50 accomplishes this using the estimated OCV and the temperature signal (arrow T) described above. The controller 50 then calculates the above-noted sensor gain value using the state of charge ($SOC_{ECM}$) of the battery 14 at the different time points, thereafter executing one or more control actions with respect to the battery 14 when the sensor gain value exceeds a predetermined fault threshold.

Figure 2:
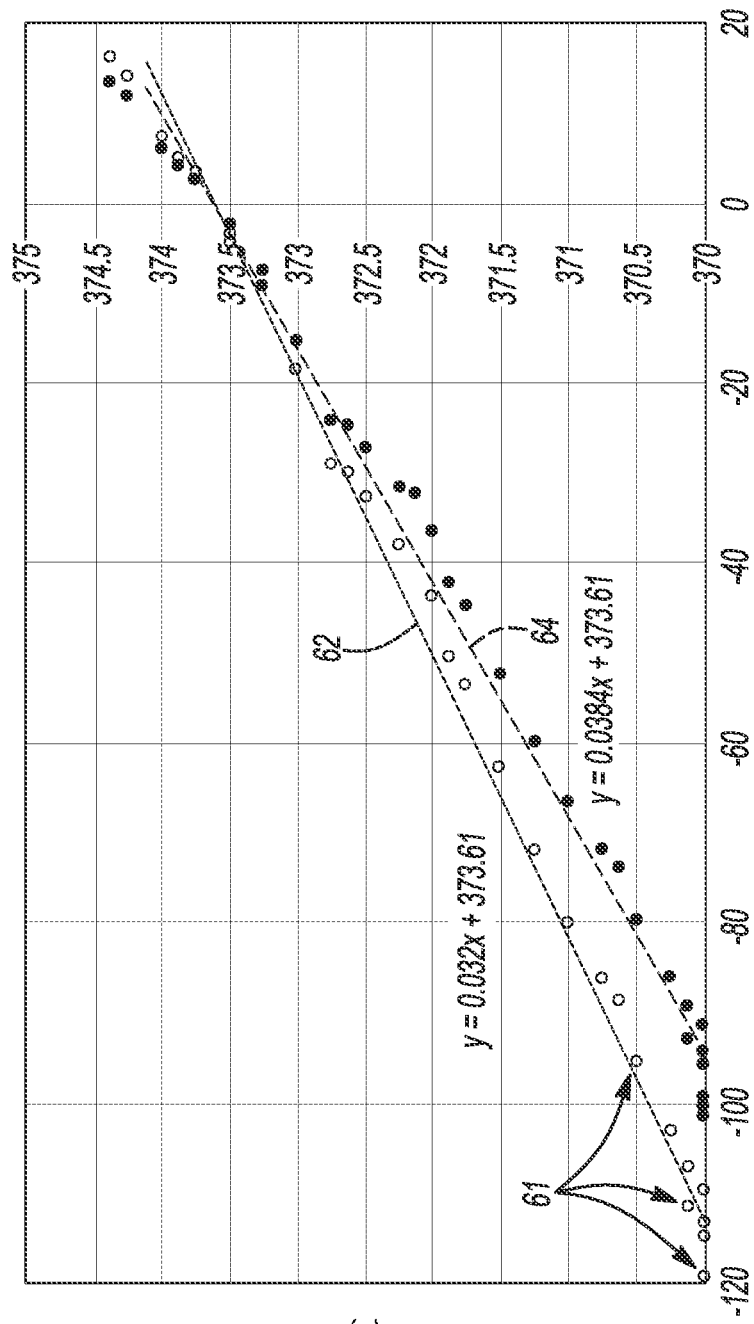
FIG. 2 is a representative current-voltage performance plot of nominally healthy and faulty current sensors, with current in Amps (A) depicted on the horizontal axis and voltage in volts (V) depicted on the vertical axis.

Referring to FIG. 2, a plot 60 illustrates a representative current-voltage performance of nominally "healthy" and "faulty" versions of the current sensor 32I of FIG. 1. Performance of the healthy sensor current sensor 32I is represented by trace 62, while performance of the faulty current sensor 32I is represented by trace 64. Current is depicted in amps (A) on the horizontal axis (x). Voltage in volts (V) is depicted on the vertical axis (y1), with estimated OCV also represented in volts being depicted on the vertical axis (y2). A comparison of the two traces 62 and 64, sharing the same intercept point (b), in this case 373.61V, shows that the corresponding slopes differ. In the illustration of FIG. 2, for instance, and using the slope intercept form y=mx+b, trace 62 may be represented as y=0.032x+373.61, while trace 64 may be represented as y=0.0384x+373.61. It is recognized herein that the two traces 62 and 64 intercept the y2 axis at the same estimated OCV, but at a different slope or gradient. Therefore, the present diagnostic strategy proceeds with this knowledge when calculating a numeric gain value and using the same in diagnosing performance of the current sensor 32I of FIG. 1, More particularly, the present gain faults of the current sensor 32I affect SOC calculations using the coulomb counting method, as opposed to calculations performed using an equivalent circuit model. In the latter case, the sensor gain fault directly affects the resistance estimate, i.e., the slope of the V-I curves, such as the representative traces 62 and 64 of FIG. 2, without affecting the OCV estimate or y2 intercept. As appreciated by those skilled in the art, coulomb counting proceeds in accordance with a well-established equation:

$$SOC_{CC} = SOC_0 + \frac{\int_{t=0}^{T} I\,dt}{Cap_{nom}}$$

where $SOC_0$ is the initial SOC, I is the current, and $Cap_{nom}$ is the battery capacity in Amp-Hrs. In contrast, the ECM equations may be represented as follows:

$V=OCV+IR$ $SOC_{ECM}=f(OCV,T)$

Thus, the present strategy includes detecting a sensor gain fault by comparing the SOC from the equivalent circuit model, i.e., $SOC_{ECM}$, with the SOC derived from coulomb counting, i.e., $SOC_{CC}$. Exemplary implementations of this strategy will now be described with reference to FIGS. 3 and 4.

FIG. 3 depicts a flowchart for implementing a method 100, which when executed offline allows the controller 50 of FIG. 1 to construct a mapping of estimated OCV (OCVest), the present temperature of the battery 14 as measured by the temperature sensor 32T, and the above-noted coulomb counting-based state of charge, i.e., $SOC_{CC}$.

Beginning with block B102, the current sensor 32I measures and outputs the current signal (arrow I), which as noted above is indicative of a measured battery current of the battery 14 of FIG. 1, whether of a given cell thereof or a collection of such cells, possibly including the entire battery 14. Block B104 performs a similar process, but with the voltage sensor 32V outputting the voltage sensor (arrow V). The method 100 proceeds to block B106 once the measured battery current and voltage have been communicated to the controller 50.

Block B106 entails processing the measured values from blocks B102 and B104 through an equivalent circuit model to thereby estimate an open circuit voltage of the battery 14 or constituent battery cells thereof. The estimated OCV, represented herein as $OCV_{est}$, is then fed into block B110.

Block B106 may be implemented in a variety of ways. For example, the controller 50 may use a method referred to herein as "segmentation" to help determine the estimated open circuit voltage, i.e., $OCV_{est}$. As appreciated in the art, the outputs of the current sensor 32I and voltage sensor 32V from respective blocks B102 and B104 are raw data that, when combined, provide a so-called VI profile. The controller 50 may be configured to identify distinct line segments by filtering out extrema in the VI profile, as appreciated in the art.

For each segment, the controller 50 may remove portions having a significantly different $$\frac{dV}{dI},$$

with "significantly" being a predetermined variation that may be application-specific. The remainder of a given segment may be retained if the segment meets predetermined criteria, such as a predetermined current spread, e.g., >60 A, if the segment crosses 0 A, and if $$\frac{dI}{dt}$$

is less than a predetermined threshold for an entire segment, such as 100 A/s in the keeping with the illustrative 80 A current spread example. A result of performing block B106 would therefore appear as FIG. 2, albeit with more line segments, with each VI line segment corresponding to a different $OCV_{est}$.

Additionally, the controller 50 may calculate a gradient between each pair of points along the various VI segments, with various points 61 shown in FIG. 2. The controller 50 may then determine median gradient, and remove pairs of points having a gradient that exceeds the median gradient by a predetermined amount, e.g., 50%. The controller 50 thus retains the longest consecutive run of point pairs having a gradient less than 50% different from the median gradient in this example, and calculates the slope (m) and y-intercept (b) of the classical y=mx+b formulation. The slope and the y-intercept may be recorded or sent offboard as resistance and $OCV_{est}$, respectively. Other approaches may be used as alternatives to the segmentation method. For example, the ECM could be used with recursive least squares method, pseudo-inverse methods, etc., as appreciated in the art.

Block B107 includes performing coulomb counting to determine the present SOC of the battery 14, with the coulomb counting approach to SOC derivation being well established in the art and described mathematically above. The coulomb counting-based SOC, i.e., $SOC_{CC}$, is then fed into block B110.

At block B108, the battery temperature is read by the temperature sensor 32T of FIG. 1 and communicated to the controller 50. The method 100 then proceeds to block B110.

Block B110 of FIG. 3 includes, for a given temperature as determined at block B108, determining $OCV_{est}$ from the V-I segment intercept, as described above. For instance, during training, to build the relevant mapping, $OCV_{est}$ and temperature are mapped to a particular $SOC_{CC}$ value at a given instant in time. During testing, this mapping is then used with temperature and $OCV_{est}$ as inputs to determine a particular SOC estimate. The result of block B110 is a plot or map of $OCV_{est}$ and temperature versus $SOC_{CC}$, which may then be recorded in memory 52 of the controller 50 as the map (M2) 56. That is, the above-described segmentation method, or suitable alternatives such as RLS, are used to generate a distinct set of OCV, temperature, and SOC data points during training of the controller 50.

A fitting method could be used to construct a mapping between temperature, OCVest, and $SOC_{CC}$, e.g., polynomial fitting, interpolation, machine learning using a Gaussian-based regression method, or using a three-axis curve, to name just a few examples. Given an OCVest and battery/cell temperature, e.g., 0° to 40° C., the $SOC_{ECM}$ as a percentage between 0% to 100% is extracted by the controller 50 and thereafter used in the method 200 described below. The generated mapping could be updated with data collected over time, along with battery aging information/data. An exemplary embodiment of the method 100 will now be described with particular reference to FIG. 4.

Figure 4:
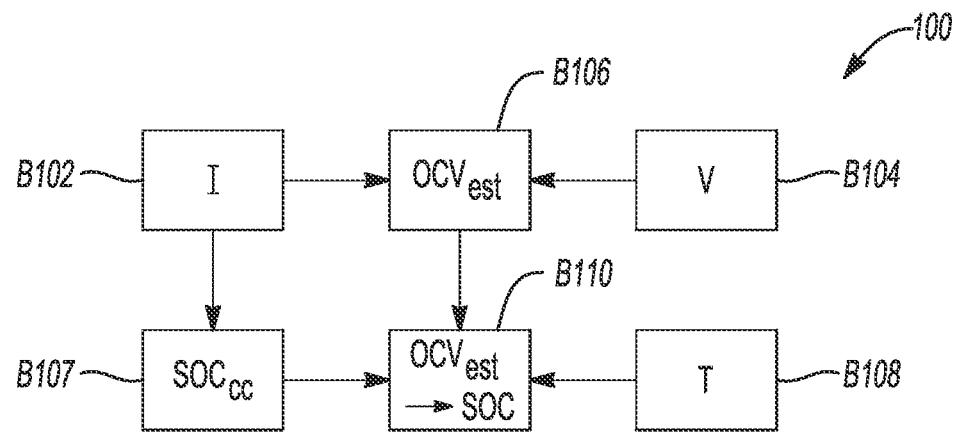
FIG. 4 is a flow chart describing a method for detecting a current sensor fault using the OCV-to-SOC map of FIG. 3.
Figure 4:
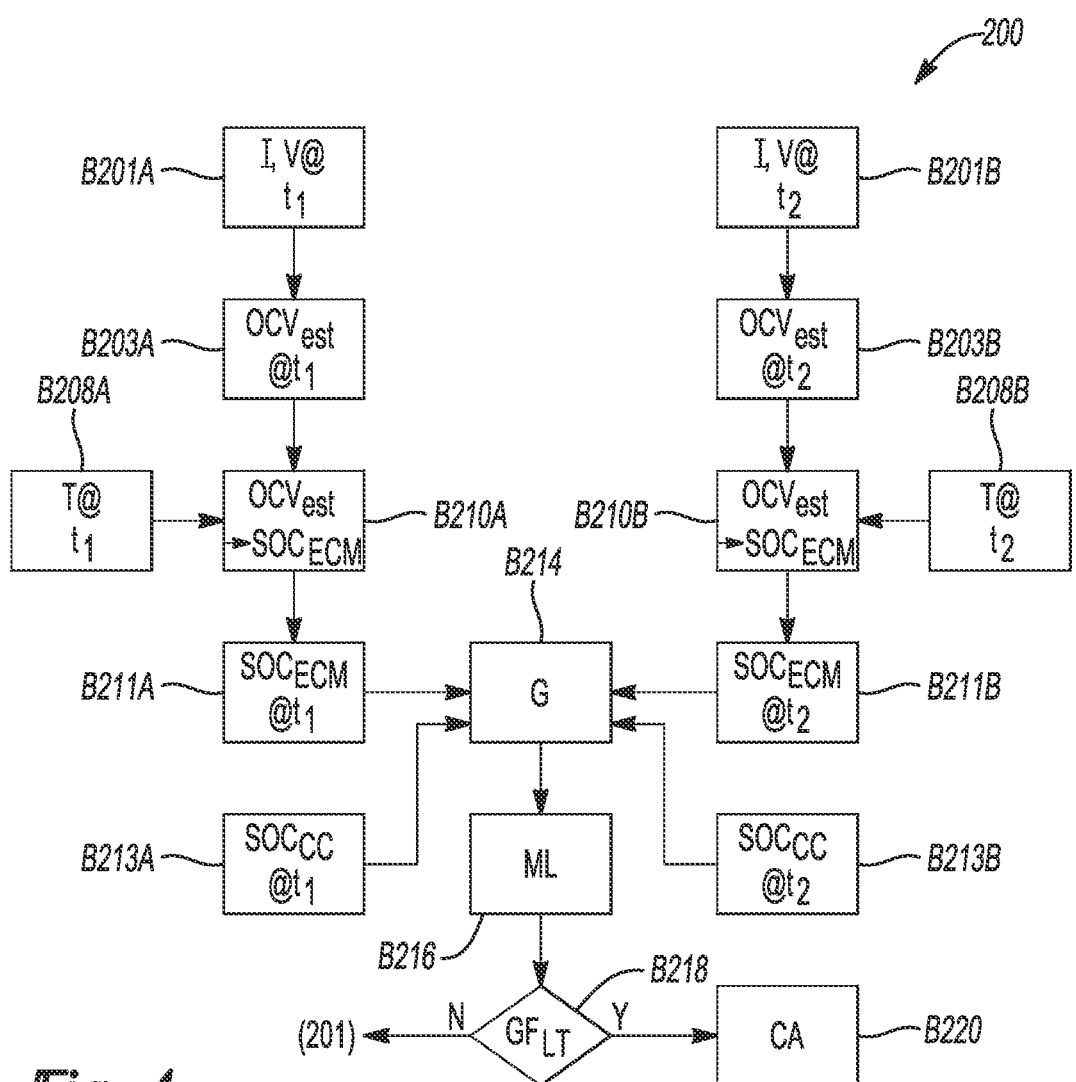

Referring now to FIG. 4, the controller 50 is configured to detect gain faults of the current sensor 32I shown in FIG. 1, informed by the $OCV_{est}$ of method 100. Beginning with blocks B201A and B201B, the controller 50 loads current and voltage data at different time points $t_1$ and $t_2$, respectively, with time $t_2$ being subsequent to time $t_1$, e.g., several seconds later. The method 200 then proceeds to blocks B203A and B203B.

Blocks B203A and B203B entail estimating the open circuit voltage ($OCV_{est}$) of the battery 14 using the values provided from blocks B201A and B201B. This occurs as set forth above in block B106. The method 200 then proceeds to block B210A and B210B.

At blocks B208A and B208B, the battery temperature (arrow T) of FIG. 1 is measured at time point $t_1$ (block B208A) and $t_2$ (block B208B), using the temperature sensor(s) 32T. The measured values are respectively provided to blocks B210A and B210B.

At blocks B210A and B210B, the method 200 includes processing the measured temperature at $t_1$ and $t_2$ from respective blocks B208A and 208B, and the $OCV_{est}$ at the same time points from respective blocks B203A and 203B. The method 200 then proceeds to blocks B211A and B211B.

Blocks B211A and B211B entail determining the state of charge using the mapping from block B110 of FIG. 3, for time points $t_1$ and $t_2$. The two $SOC_{ECM}$ values for time points $t_1$ and $t_2$ are then fed into block B214.

At blocks B213A and B213B, once again for time points $t_1$ and $t_2$, the controller 50 loads the coulomb counting-based state of charge, i.e., $SOC_{CC}$, and then proceeds to block B214.

At block B214 of FIG. 4, the method 200 proceeds by calculating the sensor gain value (G), e.g., using the function:

$$\frac{\Delta SOC_{CC}}{\Delta SOC_{ECM}}$$

with $\Delta SOC_{CC}$ being the difference between respective coulomb counting-based SOC values at the first and second time points $t_1$ and $t_2$, and $\Delta SOC_{ECM}$ being the difference between respective states of charge ($SOC_{ECM}$) of the battery 14 at the same two time points. The method 200 then proceeds to block B216.

Block B216 acts as maturation logic (ML) prior to performing subsequent control actions. In particular, block B216 may be used to detect gain faults over the duration of a trip as opposed to at a single/discrete point in time. Maturation criteria may be used to confirm that the issue persists over multiple trips. For example, the controller 50 may collect sensor gain values (G) for a predetermined number (Y) of trips before proceeding to block B218.

At block B218, the controller 50 next compares the sensor gain (G) to a threshold to determine whether a gain fault is present. Block B218 in some embodiments may entail comparing the gain value (G) to a calibrated threshold, e.g., 20-30%. Alternatively, based on the above-noted maturation logic, the controller 50 may evaluate whether the gain (G) exceeded the threshold for X of Y trips, for instance 7 of 10 trips, or whether a time series progression or trajectory of the gain is indicative of a gain fault. The method 200 then proceeds to block B220.

Method 200 finishes at block B220 with the controller 50 executing a control action with respect to the battery 14 when the sensor gain value (G) exceeds a predetermined fault threshold. Block B220 may include generating a fault notification indicative of a fault of the shunt resistor, and/or selectively adjusting the measured pack current based on the sensor gain value (G). In a particular implementation, the controller 50 may be configured for selectively adjusting the measured pack current based on the sensor gain value (G) when the sensor gain value (G) is less than a predetermined service threshold, so as to generate a corrected current value ($I_{COR}$). This may occur using an equation, $$I_{COR} = \frac{I_M}{G},$$

in which $I_M$ is the measured pack current. The controller 50 may also be configured to request a maintenance action of the battery 14 when the sensor gain value (G) exceeds the service threshold.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims. Moreover, this disclosure expressly includes combinations and sub-combinations of the elements and features presented above and below.

What is claimed is:

1. A battery electric system, comprising:
    a battery;
    a sensor suite, including a current sensor operable for outputting a current signal indicative of a measured current of the battery, a voltage sensor operable for outputting a voltage signal indicative of a measured voltage of the battery, and a temperature sensor operable for outputting a temperature signal indicative of a measured temperature of the battery; and
    a controller in communication with the sensor suite, and configured to:
        determine an estimated open circuit voltage of the battery at different time points using the current signal, the voltage signal, and an equivalent circuit model (ECM);
        determine an ECM-based state of charge of the battery at the different time points, via a calibrated SOC map, using the estimated open circuit voltage and the measured temperature;
        calculate a sensor gain value using the ECM-based state of charge (SOC) of the battery at the different time points and a coulomb counting-based SOC at the different time points; and
        execute a control action with respect to the battery when the sensor gain value exceeds a predetermined gain fault threshold, including generating a fault notification signal indicative of a fault of the current sensor.

2. The battery electric system of claim 1, wherein the controller is configured to determine the ECM-based SOC of the battery as a function of the estimated open circuit voltage of the battery and the measured temperature, such that:

$$SOC_{ECM} = f(OCV_{est}, T)$$

wherein $OCV_{est}$ is the estimated open circuit voltage and T is the measured temperature.

3. The battery electric system of claim 1, wherein the battery comprises a propulsion battery pack for a motor vehicle.

4. The battery electric system of claim 1, wherein the control action includes selectively adjusting the measured current based on the sensor gain value.

5. The battery electric system of claim 4, wherein the controller is configured to selectively generate a corrected current value based on the sensor gain value using an equation:

$$I_{COR} = \frac{I_M}{G}$$

wherein $I_{COR}$ is the corrected current value, $I_M$ is the measured current and G is the sensor gain value.

6. The battery electric system of claim 5, wherein the controller is configured to request a maintenance action of the battery based on the sensor gain value.

7. The battery electric system of claim 1, wherein the controller is configured to calculate the sensor gain value as:

$$\frac{\Delta SOC_{CC}}{\Delta SOC_{ECM}}$$

wherein $\Delta SOC_{CC}$ a difference between the coulomb counting-based SOC at the different time points, and $\Delta SOC_{ECM}$ is a difference between the ECM-based SOC at the different time points.

8. The battery electric system of claim 1, wherein the controller is configured to executing maturation logic to determine whether a time series progression or trajectory of the gain value is indicative of the fault of the current sensor.

9. A method for diagnosing a current sensor fault in a battery electric system, comprising:
    measuring, via a respective current sensor, voltage sensor, and temperature sensor of a battery within the battery electric system, a current signal indicative of a measured current of the battery, a voltage signal indicative of a measured voltage of the battery, and a temperature signal indicative of a measured temperature of the battery;

determining an estimated open circuit voltage of the battery at different time points using the current signal, the voltage signal, and an equivalent circuit model (ECM);

determining an ECM-based state of charge (SOC) of the battery at the different time points, via a calibrated SOC map, using the estimated open circuit voltage and the measured temperature;

calculating a sensor gain value using the ECM-based SOC of the battery at the different time points and a coulomb counting-based SOC of the battery at the different time points; and executing a control action with respect to the battery, via a processor of the battery electric system, when the sensor gain value exceeds a predetermined gain fault threshold, including generating a fault notification signal indicative of a fault of the current sensor.

10. The method of claim 9, further comprising determining the ECM-based state of charge of the battery as a function of the estimated open circuit voltage of the battery and the measured temperature, such that:

$$SOC_{ECM}=f(OCV_{est},T)$$

wherein $OCV_{est}$ is the estimated open circuit voltage and T is the measured temperature.

11. The method of claim 9, wherein executing the control action includes selectively adjusting the measured current based on the sensor gain value.

12. The method of claim 11, further comprising generating a corrected current value ($I_{COR}$) based on the sensor gain value when the sensor gain value is less than a predetermined service threshold, using an equation:

$$I_{COR} = \frac{I_M}{G}$$

wherein $I_M$ is the measured current and G is the sensor gain value.

13. The method of claim 12, further comprising requesting a maintenance action of the battery via the controller based on the sensor gain value.

14. The method of claim 9, further comprising calculating the sensor gain value as a ratio:

$$\frac{\Delta SOC_{CC}}{\Delta SOC_{ECM}}$$

wherein $\Delta SOC_{CC}$ is a difference between the coulomb counting-based SOC at the different time points, and $\Delta SOC_{ECM}$ is a difference between the ECM-based SOC at the different time points.

15. The method of claim 9, further comprising executing maturation logic to determine whether a time series progression or trajectory of the gain value is indicative of the fault of the current sensor.

16. A motor vehicle comprising:
a set of road wheels; and
an electrified powertrain system operable for outputting a drive torque to the road wheels to propel the motor vehicle, the electrified powertrain system comprising:
a propulsion battery pack;
an electric traction motor connected to the propulsion battery pack, and operable for generating the drive torque when energized by a discharge of the propulsion battery pack;
a sensor suite, including a current sensor operable for outputting a current signal indicative of a measured current of the propulsion battery pack, a voltage sensor operable for outputting a voltage signal indicative of a measured voltage of the propulsion battery pack, and a temperature sensor operable for outputting a temperature signal indicative of a measured temperature of the propulsion battery pack; and
a vehicle controller in communication with the sensor suite, and configured to:
determine an estimated open circuit voltage of the propulsion battery pack at different time points using the current signal, the voltage signal, and an equivalent circuit model (ECM);
determine an ECM-based state of charge (SOC) of the propulsion battery pack at the different time points, via a calibrated SOC map, using the estimated open circuit voltage and the measured temperature;
calculate a sensor gain value using the ECM-based state of charge of the propulsion battery pack at the different time points and a coulomb counting-based SOC of the propulsion battery pack at the different time points; and
execute a control action with respect to the propulsion battery pack when the sensor gain value exceeds a predetermined gain fault threshold, including generating a fault notification signal indicative of a fault of the current sensor.

17. The motor vehicle of claim 16, wherein the vehicle controller is configured to determine the ECM-based state of charge of the propulsion battery pack as a function of the estimated open circuit voltage and the measured temperature, such that:

$$SOC_{ECM}=f(OCV_{est},T)$$

wherein $OCV_{est}$ is the estimated open circuit voltage and T is the measured temperature.

18. The motor vehicle of claim 16, wherein the control action includes selectively adjusting the measured current based on the sensor gain value by generating a corrected current value ($I_{COR}$) based on the sensor gain value using an equation:

$$I_{COR} = \frac{I_M}{G}$$

wherein $I_M$ is the measured current and G is the sensor gain value.

19. The motor vehicle of claim 18, wherein the vehicle controller is configured to execute maturation logic to determine whether a time series progression or trajectory of the gain value is indicative of the fault of the current sensor.

20. The motor vehicle of claim 16, wherein the vehicle controller is configured to calculate the sensor gain value using the ECM-based SOC of the propulsion battery pack and a coulomb counting-based state of charge as a ratio:

$$\frac{\Delta SOC_{CC}}{\Delta SOC_{ECM}}$$

wherein $\Delta SOC_{CC}$ is a difference between the coulomb counting-based SOC at the different time points, and $\Delta SOC_{ECM}$ is a difference between the ECM-based SOC at the different time points.

* * * * *